(12) United States Patent
Ohki (10) Patent No.: US 8,711,100 B2
(45) Date of Patent: Apr. 29, 2014

(54) SIGN LANGUAGE KEYBOARD AND SIGN LANGUAGE SEARCHING APPARATUS USING THE SAME

(76) Inventor: Junto Ohki, Takasaki (JP)

( * ) Notice: Subject to any disclaimer, the term of this patent is extended or adjusted under 35 U.S.C. 154(b) by 51 days.

(21) Appl. No.: 13/146,533

(22) PCT Filed: Jan. 25, 2010

(86) PCT No.: PCT/JP2010/050897
§ 371 (c)(1),
(2), (4) Date: Jul. 27, 2011

(87) PCT Pub. No.: WO2010/087301
PCT Pub. Date: Aug. 5, 2010

(65) Prior Publication Data
US 2011/0285635 A1 Nov. 24, 2011

(30) Foreign Application Priority Data
Jan. 27, 2009 (JP) ................................. 2009-035850

(51) Int. Cl.
*G06F 3/02* (2006.01)
*G09G 5/00* (2006.01)

(52) U.S. Cl.
USPC ............................ 345/171; 345/168; 345/172

(58) Field of Classification Search
USPC ......................................... 345/171, 168, 172
See application file for complete search history.

(56) References Cited

U.S. PATENT DOCUMENTS

| 5,659,764 A * | 8/1997 | Sakiyama et al. ................. 704/3 |
| 5,990,878 A * | 11/1999 | Ikeda et al. .................... 715/236 |
| 2008/0183460 A1* | 7/2008 | Baker et al. ....................... 704/3 |

FOREIGN PATENT DOCUMENTS

| JP | 2000-089660 | 3/2000 |
| JP | 2003-044203 | 2/2003 |
| JP | 2005-099977 | 4/2005 |
| JP | 2008-216397 | 9/2008 |

OTHER PUBLICATIONS

International Search Report dated Mar. 9, 2010 issued to international application No. PCT/JP2010/050897.
Extended European search report dated Dec. 9, 2013 in corresponding European Application No. 10735769.1.
Buttussi, Fabio et al., Using web3D technologies for visualization and search of sign in an international sign language dictionary, Association for Computing Machinery, Inc., Apr. 15, 2007, pp. 61-70, 211.
Sutton, Valerie, Sutton Movement Writing(TM) SSS-2004, The International Movement Writing Alphabet (IMWA), 2004, Center for Sutton Movement Writing.

* cited by examiner

*Primary Examiner* — Aneeta Yodichkas
(74) *Attorney, Agent, or Firm* — Knobbe Martens Olson & Bear LLP (57) ABSTRACT

Expression by sign language can be inputted more easily and reliably, and search can be performed therefor as well. A general-purpose keyboard is divided into finger input areas in which shapes of fingers are allotted to respective key tops and upper body input areas in which divided portions of an upper body of a sign language talker are allotted to key tops so that information, which is meant by the sign language, can be inputted by the aid of the keyboard in cooperation of key inputs of the respective areas.

6 Claims, 10 Drawing Sheets

| INPUT KEY | SIGN LANGUAGE SEARCH RESULT |
|---|---|
| ~203 | I        SIGN LANGUAGE<br>TOMORROW    THINK<br>HEAR        PLAY |

FIG. 10

| | |
|---|---|
| <br>203  101 | TOMORROW    THINK<br>HEAR        PLAY |

FIG. 11

SIGN LANGUAGE KEYBOARD AND SIGN LANGUAGE SEARCHING APPARATUS USING THE SAME

CROSS-REFERENCE TO RELATED APPLICATIONS

This application is the U.S. National Phase under 35 U.S.C. §371 of International Application PCT/JP2010/050897, filed Jan. 25, 2010, which was published in a non-English language, which claims priority to JP Application No. 2009-035850, filed Jan. 27, 2009.

TECHNICAL FIELD

The present invention relates to a sign language keyboard which is utilizable in the visual communication expressed by the sign language (finger language), and a sign language searching apparatus (retrieval apparatus) based on the use of the same.

BACKGROUND ART

Conventionally, the sign language is used in many cases as the information transmission means for the hearing-impaired persons. The sign language is the visual language in which the finger action and the non-finger action are simultaneously used, and the sign language is on the same level as that of the voice language. However, there has been a problem in relation to the way of correlation between the expression by the sign language and the electronic information.

For example, Japanese Patent Application Laid-open No. 2008-216397 (Patent Document 1) discloses the following technique in order that both of the person who is not hearing-impaired and the person who is hearing-impaired can recognize the information contents easily, quickly, and correctly. That is, the sentence data is subjected to the morphological analysis to extract keywords, and the conversion is performed from the keywords into the itemized text data and the fragmented sign language picture image data to provide a visual display to the hearing-impaired person.

Further, those skilled in the art may easily conceive the proposal of such a technique that the upper body (upper half of the body) of a sign language user (talker) is photographed as an animation image which is subjected to the image analysis to perform the conversion into words and sentences.

PRIOR ART DOCUMENTS

Patent Documents

Patent Document 1: Japanese Patent Application Laid-open No. 2008-216397.

SUMMARY OF THE INVENTION

Problems to be Solved by the Invention

However, the technique described in Japanese Patent Application Laid-open No. 2008-216397 (Patent Document 1) requires a plurality of operations including the process in which the inputted sentence data is subjected to the morphological analysis and the process in which the obtained result is further converted into the previously prepared fragmented sign language picture image data. Therefore, a problem arises such that the meaning content of the sentence data is hardly reflected to the fragmented sign language picture image correctly.

Further, the technique, in which the action of the sign language user is photographed in the animation image which is subjected to the image analysis, involves such a problem that it is difficult to perform the image analysis, because the finger action and the non-finger action delicately differ depending on the character or personality of the sign language user, and the cooperating action of the both also has the character or personality.

Further, the expression by the sign language requires the large motions of the both hands and the upper body. Therefore, it is also feared that the expression by the sign language may be difficult in view of the body power for the hearing-impaired persons who are impaired in fingers and/or hands and/or who are aged.

That is, it has been demanded to bring about the appearance of an input system which is handled more easily or simply when information is inputted in the communication in which the sign language is used as the interface when at least one person is a hearing-impaired person.

On the other hand, the sign language expresses the meaning content by means of the cooperation of the finger action and the non-finger action. However, it is difficult to speculate the meaning content of the sign language from the both actions. Only such a method has been known that cards or the like, which are previously divided or classified into those of the finger action and those of the non-finger action, are prepared to learn the meaning contents thereof.

The present invention has been made taking the foregoing circumstances into consideration, a first object of which is to provide an input apparatus which makes it possible to perform the input easily and conveniently by taking the notice of such a characteristic that the sign language is composed of a finger action and a non-finger action.

A second object of the present invention is to provide a searching apparatus (retrieval apparatus) which makes it possible to search or retrieve the meaning content of the sign language according to a finger action and a non-finger action.

Means for Solving the Problems

The present invention includes the following means.

As defined in Claim 1, the present invention resides in an input apparatus for inputting sign language information to express a meaning content in cooperation of a finger action and a non-finger action; the input apparatus comprising a plurality of upper body input areas in which at least upper body portions of a talker are represented in a divided manner; finger input areas in which shapes of fingers are allotted thereto one by one; and wrist state input areas which represent an action in which a wrist of the talker is directed vertically upwardly, an action in which the wrist of the talker is directed vertically downwardly, and an action in which the wrist of the talker is directed in a horizontal direction respectively; wherein a sign language expression, which is dynamically changeable, can be inputted by discriminating, by an input discrimination unit, the shape of the finger inputted by the finger input area, the portion of the upper body inputted continuously thereto, and the action of the wrist inputted optionally.

Accordingly, the input apparatus is divided into the upper body input areas, the finger input areas, and the wrist state input areas. Therefore, the input can be performed smoothly in cooperation of the finger action and the non-finger action.

It is possible to input the information meant by the sign language extremely conveniently.

As defined in Claim 2 of the present invention, the input apparatus is a keyboard in which the upper body input areas, the finger input areas, and the wrist state input areas are allotted to a general-purpose keyboard respectively. When the respective areas are allotted to the general-purpose keyboard as described above, it is possible to input the sign language inexpensively, easily, and conveniently without newly redesigning the physical construction of the hardware.

As defined in Claim 3 of the present invention, the upper body input areas are arranged on a left side of the keyboard with respect to a sign language input operator, the finger input areas are arranged on a right side of the keyboard, and the wrist state input areas are arranged at an upper portion of the keyboard.

Accordingly, it is possible to obtain the optimum arrangement when the general-purpose keyboard is used in order to input the sign language.

As defined in Claim 4 of the present invention, the upper body input areas, the finger input areas, and the wrist state input areas are displayed on a touch panel screen respectively as a keyboard image on a planar input screen.

Accordingly, it is possible to use, for example, a personal computer which has a touch panel display screen and a touch pad on which the areas are displayed by the printing on a pad surface, as the physical input apparatus or device. It is possible to arrange the respective areas without being restricted to the physical structure of the keyboard apparatus.

As defined in claim 5, the present invention resides in a sign language searching apparatus for searching meaning information of sign language from a finger action and a non-finger action; the searching apparatus comprising an input unit including a plurality of upper body input areas in which at least upper body portions of a talker are represented in a divided manner; finger input areas in which shapes of fingers are allotted thereto one by one; and wrist state input areas which represent an action in which a wrist of the talker is directed vertically upwardly, an action in which the wrist of the talker is directed vertically downwardly, and an action in which the wrist of the talker is directed in a horizontal direction respectively; and a control unit which acquires finger action information from an input from the finger input area of the input unit and which thereafter predicts non-finger action information possibly combined with the finger action information, i.e., an input from the upper body input area and an input from the wrist state input area to read a significant word composed of a combination of the finger action information and the non-finger action information stored in a storage unit so that the significant word is displayed on a display unit.

Accordingly, the non-finger action, which may be combined by using the finger action as the starting action, is predicted, and the significant word, which is meant by the combination, is displayed on the display unit by merely designating the finger input area to which the finger action is allotted at first. Therefore, it is possible to perform the sign language search.

As defined in Claim 6 of the present invention, the control unit acquires the finger action information to read the significant word composed of the combination of the finger action information and the non-finger action information stored in the storage unit so that the significant word is displayed on the display unit; and the control unit thereafter performs limiting search for the significant word by combining the finger action information and upper body input information and/or wrist state input information if any information is further inputted from the upper body input area and/or the wrist state input area so that search result information is displayed on the display unit.

Accordingly, the word candidate can be further limited or restricted in accordance with the inputs from the upper body input area and the wrist state input area continuously to the input from the finger input area.

Effects of the Invention

According to the sign language keyboard of the present invention, it is possible to search the expression based on the sign language and the meaning content thereof more easily, conveniently, and appropriately.

EMBODIMENTS FOR CARRYING OUT THE INVENTION

An embodiment of the present invention will be explained below with reference to the accompanying drawings.

Embodiment

Figure 1:
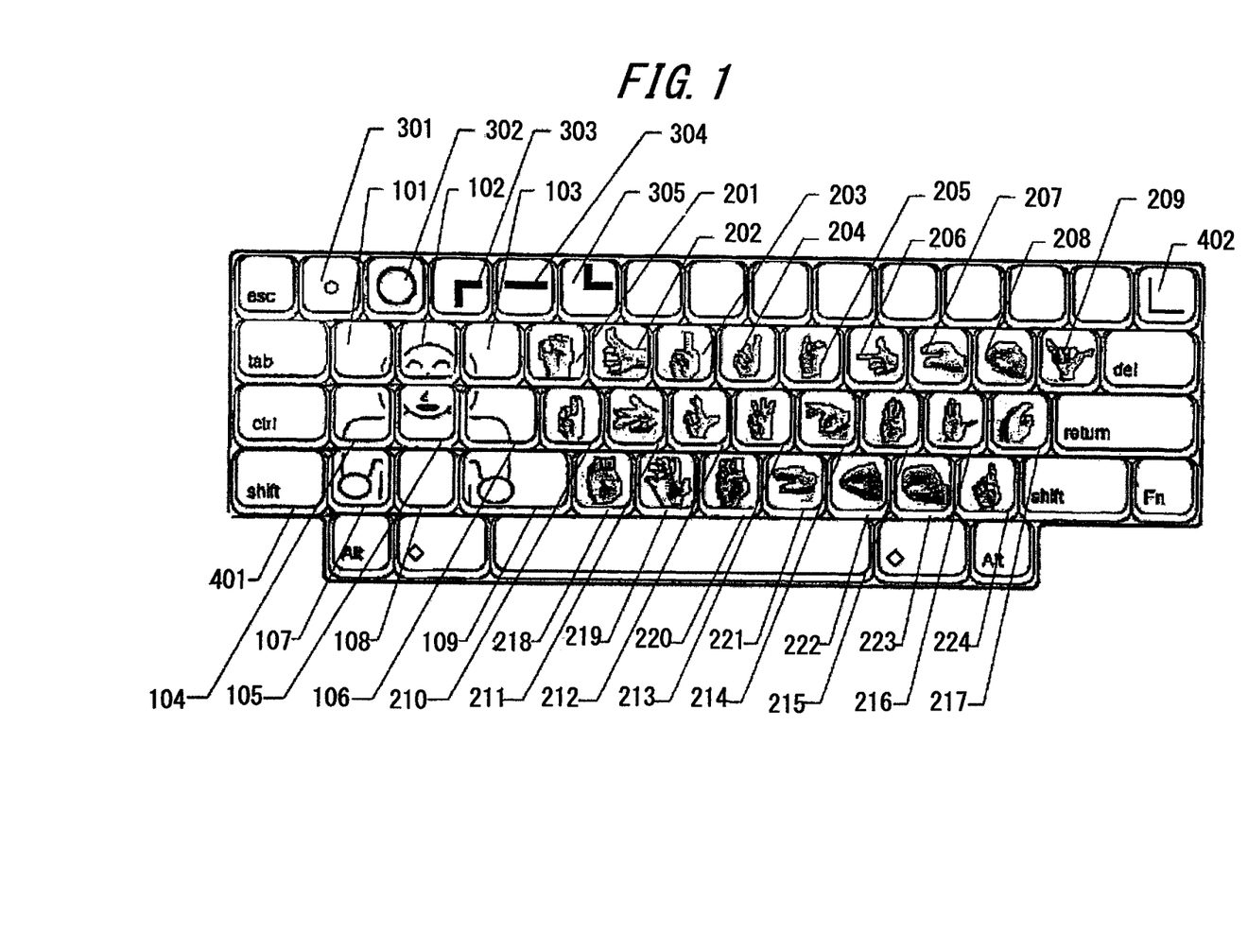
FIG. 1 illustrates an arrangement of a keyboard as an embodiment of the present invention.

The sign language keyboard of the present invention is a general-purpose keyboard apparatus or device provided with key tops shown in FIG. 1. Upper body input areas, finger input areas, and wrist state input areas are arranged and allotted respectively with respect to the respective key tops.

More specifically, the upper body input areas (101 to 109) are arranged on the left side, the finger input areas (201 to 224) are arranged on the right side, and the wrist state input areas (301 to 305) are arranged at the upper portion as viewed from the side of an input operator for the keyboard (confronting side) as shown in FIG. 1.

Figure 2:
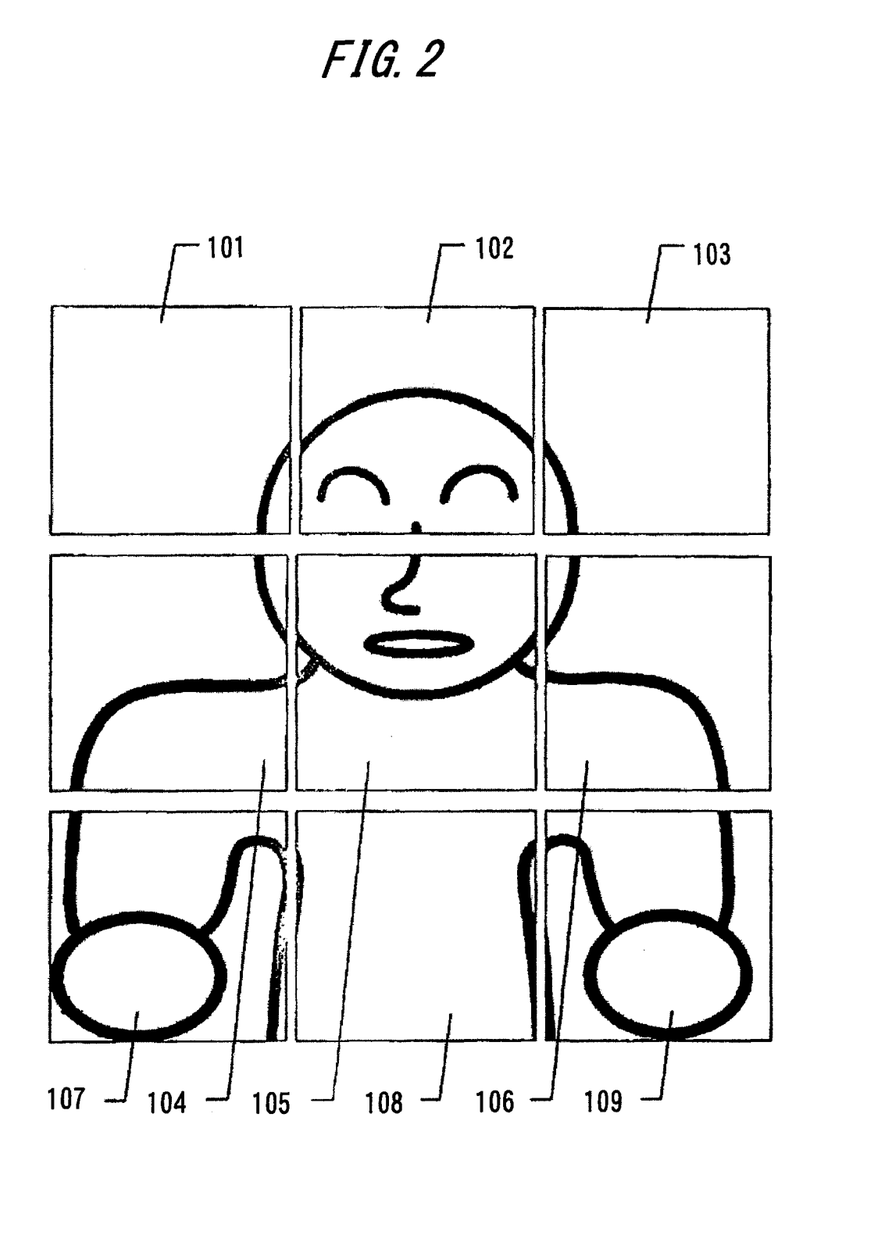
FIG. 2 illustrates upper body input areas in the embodiment.

The upper body input areas are composed of nine keys indicated by the key tops 101 to 109. Reference numeral 101 indicates the upper-left head portion, 102 indicates the central upper head portion, 103 indicates the upper-right head portion, 104 indicates the left shoulder portion, 105 indicates the lower face portion, 106 indicates the right shoulder portion, 107 indicates the left hand portion, 108 indicates the abdominal portion, and 109 indicates the right hand portion.

The finger input areas are composed of twenty-four keys indicated by the key tops 201 to 224. The finger shapes, which are used for the sign language, are allotted and displayed respectively on the respective key tops.

Further, the wrist state input areas are composed of five keys indicated by the key tops 301 to 305.

The left shift key 401 is the key to select the shape of the left hand. The left hand finger input is realized by pushing or depressing the left shift key 401 and then pushing or depressing the finger input keys 201 to 224. In relation to the right hand, the right hand finger input mode is provided when the left shift key 401 is not depressed. Further, the finger input mode based on the left hand may be always provided by using Caps Lock (function realized by simultaneously depressing the shift key "Shift" and the control key "Ctrl").

Further, a key (finger bending key 402), in which the "L-shaped pattern" of finger bending is displayed on the key top, is also prepared. The number of the actions in which the finger is bent is basically small. Therefore, when any one of the finger input keys 201 to 224 is depressed, and the finger bending key 402 is depressed once thereafter, then the action of "bending" is inputted. Further, when the finger bending key 402 is depressed again, the action, in which the "bent finger is restored", is inputted. The case, in which the finger is bent by not less than 90 degrees, is judged that the finger is bent. The case, which is in such a degree that the finger is bent slightly, is judged that the finger is not bent, on the keyboard.

Parts of the wrist state input keys 301, 302 include the small circular shape and the large circular shape displayed on the key tops, which mean "small" and "large" to represent the extent of the sign language. The wrist state input keys 303 to 305 mean the angles of the wrist. The key 303 in which the wrist is directed vertically downwardly, the key 304 in which the wrist is directed horizontally, and the key 305 in which the wrist is directed vertically upwardly are arranged.

Although the representation on the key top is omitted, it is also allowable the functions as the short cut keys for the conjunction and the like including, for example, "but" and "desu (Japanese phonetic) (honorific expression)" may be allotted to the keys other than the keys explained above.

The sign language keyboard is connected to a general-purpose personal computer by means of a wireless interface such as the USB interface, Bluetooth, the infrared communication or the like. Although not shown, the personal computer has a central processing unit (CPU) as the center to which, for example, a main memory (MM), a hard disk device (HD) as a large scale storage device, a display device (DISP) as an output device, and a printer device (PRINTING) are connected via a bus (BUS).

An application program (APL) is installed in the hard disk device (HD) together with an operating system (OS). The application program (APL) is read by the central processing unit (CPU) via the bus (BUS) and the main memory (MM), and the application program (APL) is successively executed and processed.

The application program (APL) has such a function that the sign language information, which is inputted with the sign language keyboard, is converted into a sentence meant thereby. The sentence information, which is registered in the conversion table on the basis of the analysis algorithm module in accordance with the sign language grammar, is outputted to the display device (DISP). The analysis algorithm module may be provided in the sign language keyboard, and the sentence information after the conversion may be inputted as the text code into the personal computer.

The analysis procedure, which is based on the analysis algorithm provided as the function for the sign language keyboard, will be explained below in accordance with the input procedure for the sign language keyboard.

In the case of the sign language in which the dialogue intended to be expressed is composed of two actions (for example, why?=reason→what?), the following procedure is adopted. That is, the initial shape of the hand (specified by the finger key 201 to 224) and the position (specified by the upper body input key 101 to 109) are depressed, and then the fingers are released or separated from the respective keys without performing any special action. The next shape of the hand of the sign language (specified by the finger key 201 to 224) and the position (specified by the upper body input key 101 to 109) are specified, and then the procedure is decided by the enter key.

On the other hand, in the case of the sign language of the continuous action, for example, in the case of "yoroshiku (Japanese phonetic) (please give my best regards)=best regards+give (hope)", the initial shape of the hand (specified by the finger key 201 to 224) and the position (specified by the upper body input key 101 to 109) are depressed, and then the next shape of the hand and the position are selected while depressing the keys without separating or releasing the fingers therefrom.

An explanation will be made below about the case in which further detailed sentences are inputted by the sign language keyboard.

Figure 3:
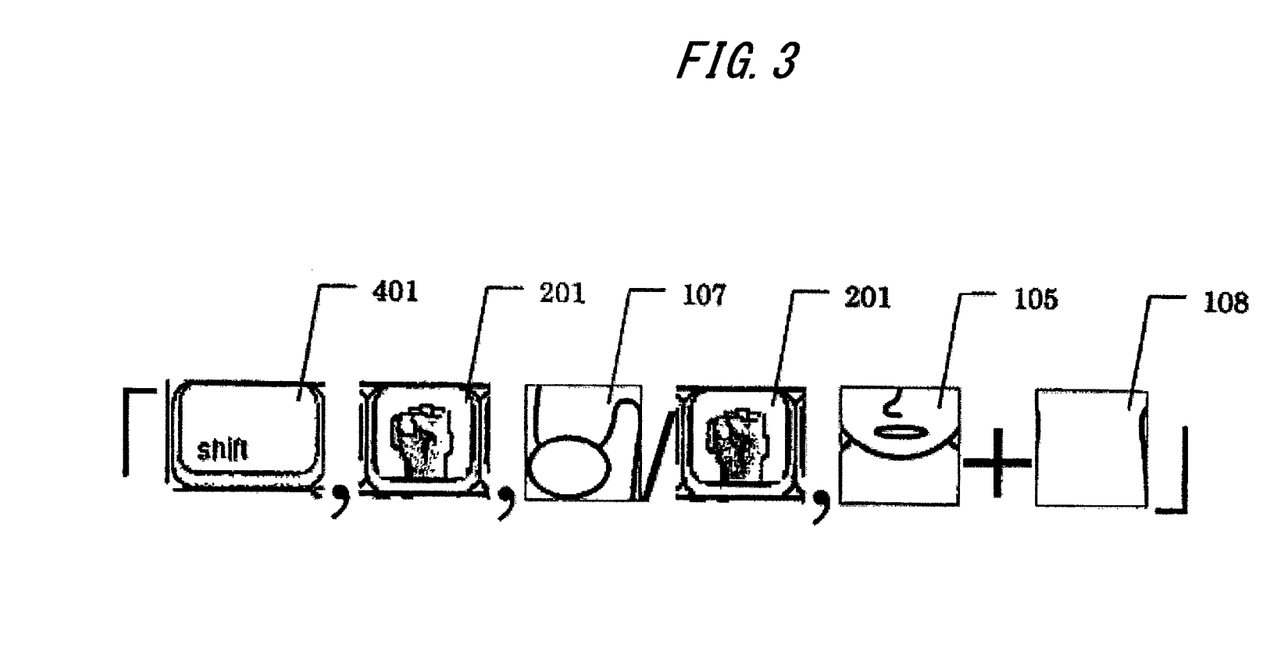
FIG. 3 illustrates an input procedure in the embodiment (1).

For example, the sign language of "otsukare-sama (Japanese phonetic) (good job, have some rest) (word used to thank someone for his/her work)" is a sign language to perform such an action that the both hands are fisted, and the right hand is moved downwardly from the position near to the neck toward the left hand placed in front of the chest. When this sign language is inputted by the sign language keyboard of this embodiment, the following procedure is performed. That is, the left shift key 401 to select the left hand is firstly depressed, and then the key 201, which means the "fist" of the finger key, is depressed. The key 107 of the left hand position of the upper body input key is depressed, and then the keys are released from the depressed states. Subsequently, the key 201, which means the "fist" of the finger key, is depressed again, and the upper body input key 108, which means the chest position, is depressed while maintaining such a state that the upper body input key 105, which indicates the neck position, is depressed. In accordance with the actions as described above, there is provided the "sign language in which the left hand is placed in the fist shape in front of the chest, the right hand is fisted, and the right hand is moved from the neck to the chest". FIG. 3 shows a procedure to depress the key tops in accordance with the procedure described above.

Figure 4:
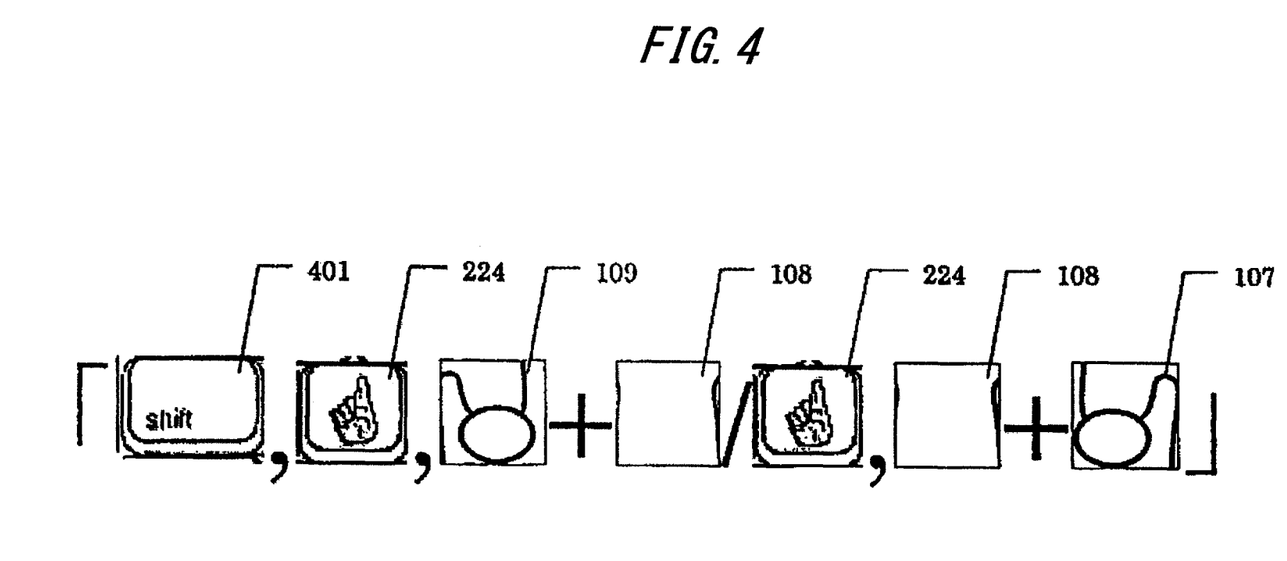
FIG. 4 illustrates an input procedure in the embodiment (2).

FIG. 4 shows a procedure in which the sign language to mean "together" is inputted by the sign language keyboard. FIG. 4 illustrates such an action that "the forefingers of the both hands are allowed to stand upstandingly and spread leftwardly and rightwardly over the chest, the fingers are allowed to progressively approach to one another, and the sides of the fingers are brought in contact with each other".

That is, an action is expressed such that "the key 108 is depressed while depressing the left shift key 401→the finger key 224→the upper body input key 109, and the keys are once released. Subsequently, the key 107 is depressed while depressing the finger key 224→the upper body input key 108, and then the respective keys are released".

Figure 5:
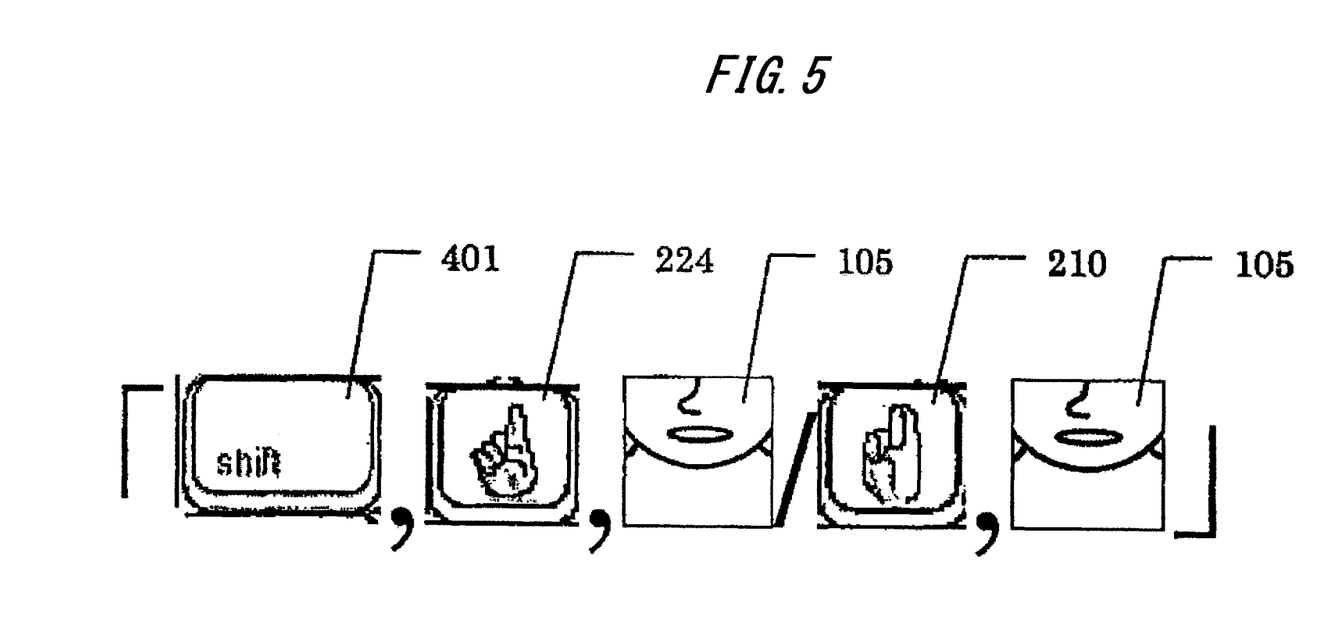
FIG. 5 illustrates an input procedure in the embodiment (3).

FIG. 5 shows a procedure in which the sign language to mean "small" is inputted by the sign language keyboard, wherein the forefinger of the left hand is allowed to stand upstandingly, the forefinger and the middle finger of the right hand are allowed to stand upstandingly, and the fingers are placed on the left and right sides of the forefinger of the left hand to thereby form "small" of Chinese character or kanji (this upwardly directed arrow-like shape resembles "small" of Chinese character or kanji).

When this sign language is inputted by the sign language keyboard of the embodiment, then the keys are depressed in an order of "left shift key 401→finger key 224→upper body input key 105", the respective keys are thereafter released, and then the "finger key 210→upper body input key 105" are depressed.

Figure 6:
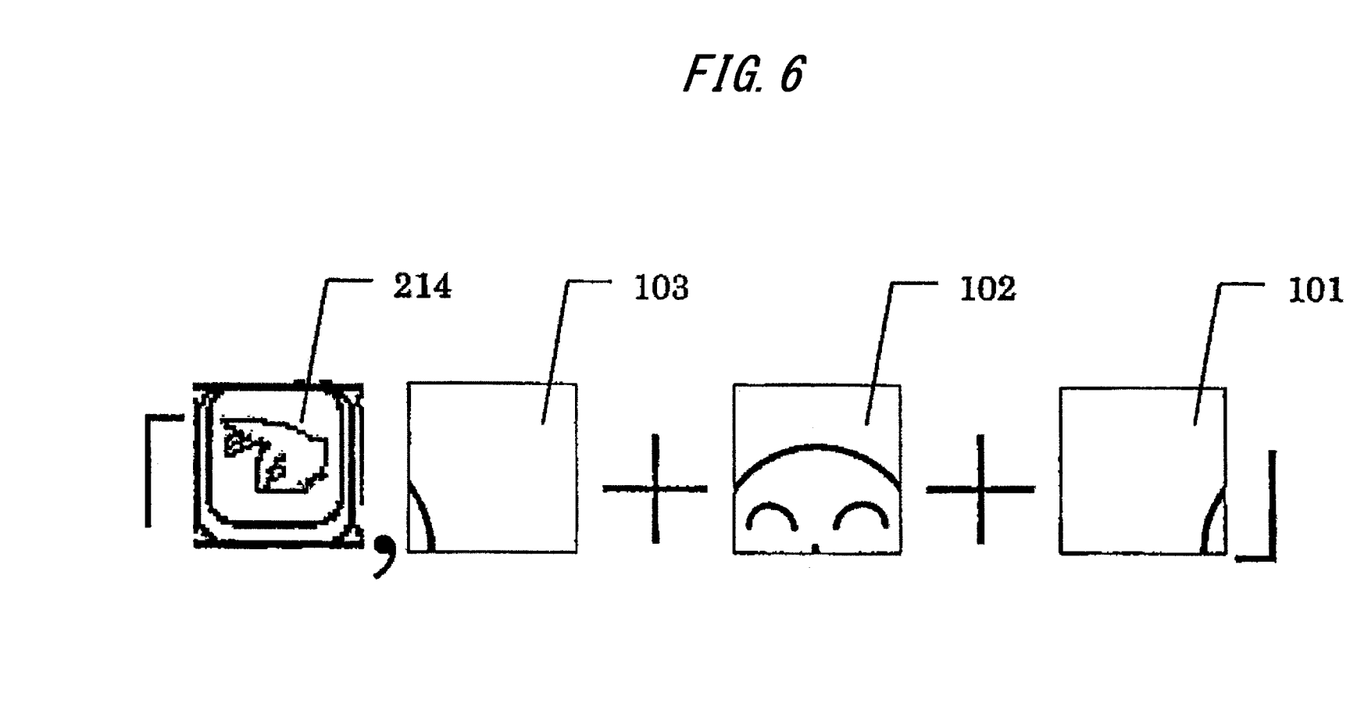
FIG. 6 illustrates an input procedure in the embodiment (4).

FIG. 6 shows a procedure in which the sign language to mean "look for" is inputted by the sign language keyboard. An action is expressed such that the "ring is formed by the forefinger and the thumb, which is moved from the left to the right at the height of the face".

Specifically, the input can be performed by "successively depressing the key 102 and the key 101 while maintaining a state in which the finger key 214→the upper body input key 103 are depressed".

Figure 7:
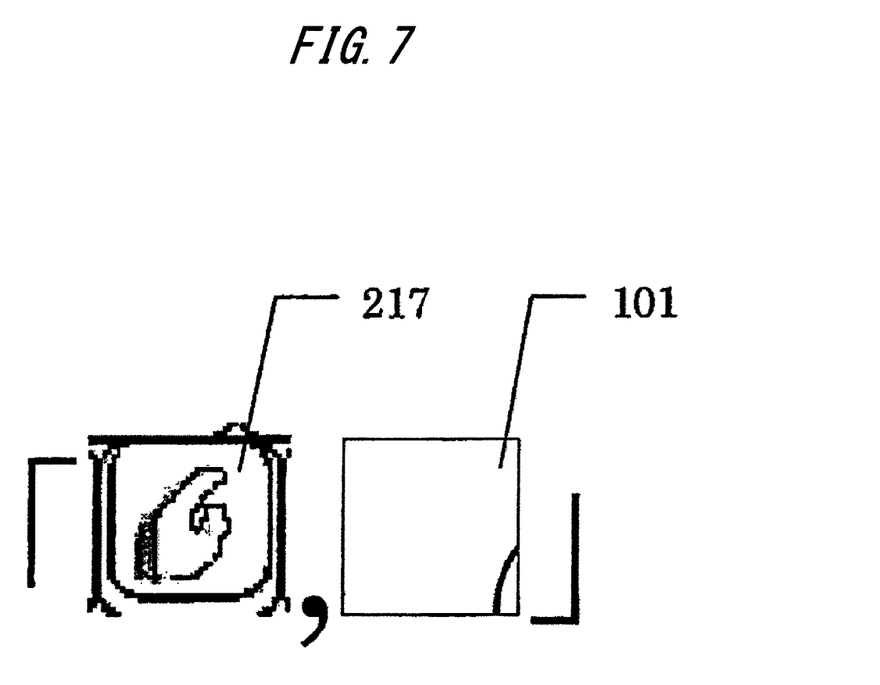
FIG. 7 illustrates an input procedure in the embodiment (5).

Further, an explanation will be made about the sign language when the "small" (small key 301) and the "large" (large key 302) are used. An action, in which the palm is rounded a little and the palm is pulled backwardly toward the back, is common to the sign languages of "short time ago", "ago", and "long time ago". However, when the action is performed in a small extent, the action means "short time ago". When the action is performed in a large extent, the action means "long time ago". When the action is performed ordinarily, the action means "ago". That is, the shape, in which the palm is narrowed, corresponds to the finger key 217. Therefore, the input of "finger key 217→upper body input key 101" (FIG. 7) is converted into "ago". The input of "finger key 217→upper body input key 101→small key 301" is converted into "short time ago" (or "short while ago"). The input of "finger key 217→upper body input key 101→large key 302" is converted into "long time ago". The actions are inputted into the personal computer.

Figure 8:
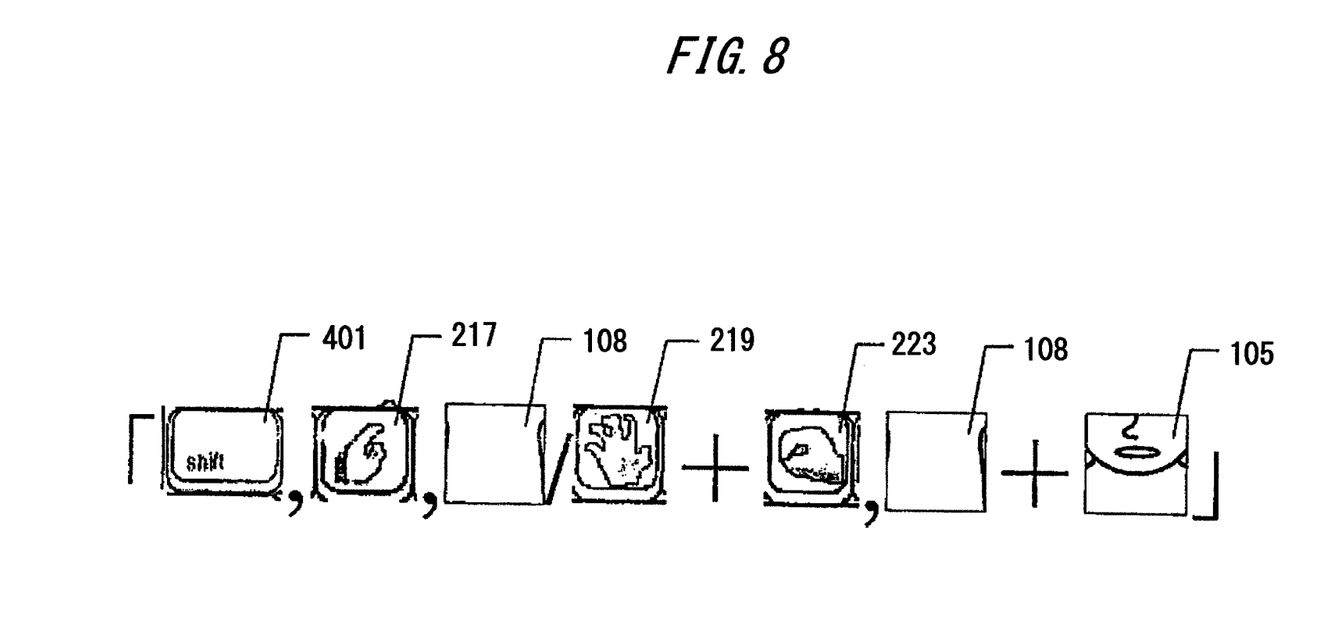
FIG. 8 illustrates an input procedure in the embodiment (6).

FIG. 8 shows a procedure in which the sign language to mean "camp" is inputted by the sign language keyboard. The "camp" requires complicated actions, because the shape of the hand is also changed while changing the position of the hand in the sign language. Specifically, an action is performed such that "the back of the left hand is directed upwardly, the left arm is placed in parallel to the body in front of the chest, the fingers of the right hand are opened and placed on the back of the left hand, and the hand is moved upwardly to the position of the neck while narrowing the hand".

With the sign language keyboard, the "left shift key 401→finger key 217→upper body input key 108" are depressed, the respective keys are released thereafter, and then the "key 223 is depressed while depressing the finger key 219". Further, the "key 105 is depressed while depressing the upper body input key 108". According to the key input as described above, the action is converted into the word "camp" which is inputted into the personal computer.

It is noted that the arrangement and the operation procedure of the keys are explained above by way of example in every sense, and the present invention is not limited to this embodiment. In short, it is appropriate that the keys, which indicate the portions of the upper body, are represented in a divided manner, and the shapes of the respective fingers are allotted to the respective keys.

Further, the embodiment described above has been explained with the sign language keyboard apparatus in which the upper body input keys and the finger keys are allotted and arranged on the general-purpose keyboard apparatus. However, it is not necessarily indispensable that the keyboard should be provided with the mechanical key depressing mechanism. For example, it is also allowable to adopt any keyboard displayed as an image on a touch panel display apparatus. Alternatively, the keyboard shown in FIG. 1 is printed on a surface of a touch pad to perform the input with a touch pen, wherein the function is provided to perform the same input as that performed by the keyboard in accordance with the touch position of the touch pen.

Next, an explanation will be made about an embodiment in which the sign language keyboard of the embodiment of the present invention is used as the input apparatus for the searching apparatus.

The keyboard is connected to an unillustrated personal computer via an interface such as USB or the like.

The personal computer is a general-purpose computer comprising, for example, a central processing unit and a main memory as central devices to which a hard disk device and a display device are connected via a bus.

For example, a sign language application program, sign language animation image data, and word database expressed by the combination of the finger action and the non-finger action are stored in the hard disk device together with an operating system. The sign language application program is successively read, executed, and processed by the central processing unit by the aid of the bus and the main memory. Accordingly, the function of this embodiment is realized as explained below.

The keyboard explained in the embodiment of the present invention (see FIG. 1) is connected to the bus via the USB interface.

When the sign language search (retrieval) is performed by using the keyboard, the central processing unit firstly reads the sign language application program to wait for the interruption process from the keyboard.

Figure 9:
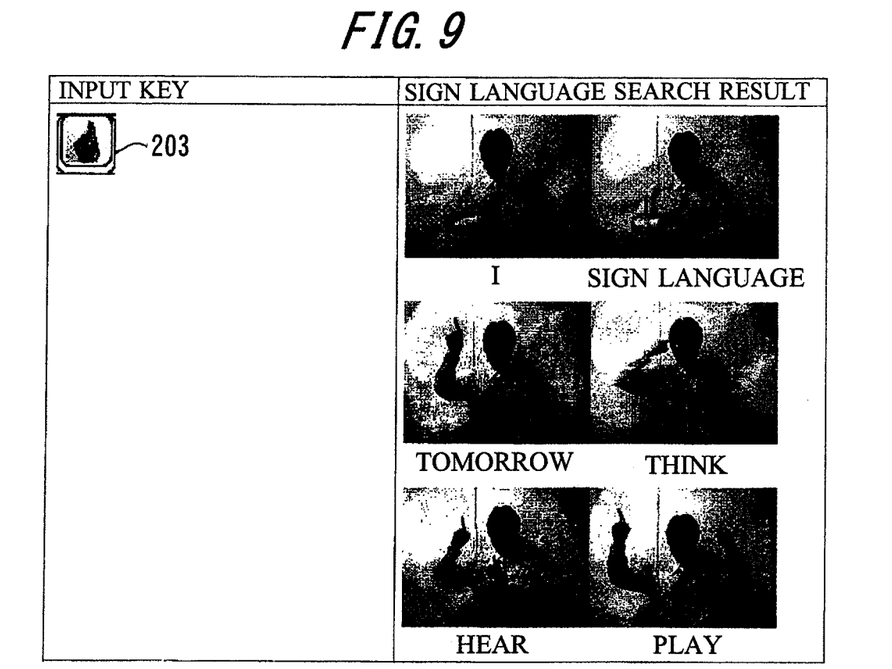
FIG. 9 illustrates a search procedure in the embodiment (1).

At first, when the finger input key of the keyboard, or the key in such a state that the forefinger is directed upwardly in this embodiment, i.e., the finger key 203 is depressed, then the sign language application program detects the interruption code of the concerning finger key, and the word or words, which use/uses the finger key, is/are read from the word database so that the candidate words are displayed on the display device together with the sign language images (see FIG. 9). In this procedure, the word database displays only the group of words which are highly frequently used, in accordance with the learning function. In FIG. 9, the six words, i.e., "I", "sign language", "tomorrow", "think", "hear", and "play", which can be expressed by using the finger action of the finger key 203, are displayed with the letters and the sign language images.

If the word of the search objective is found out at this stage, the search comes to an end.

If a large amount of the search result is retrieved by the search, the key, for example, the upper body input key 101 (key to indicate the upper-right position with respect to the head), which means the non-finger action, is depressed continuously to the input of the finger action of the finger key 203. Accordingly, the words are limited or restricted to the candidate words meant by the sign language in the state in which the forefinger is positioned at the upper-right position with respect to the head, and the limited candidate words are displayed on the display device together with the sign language images (FIG. 10).

Figure 10:
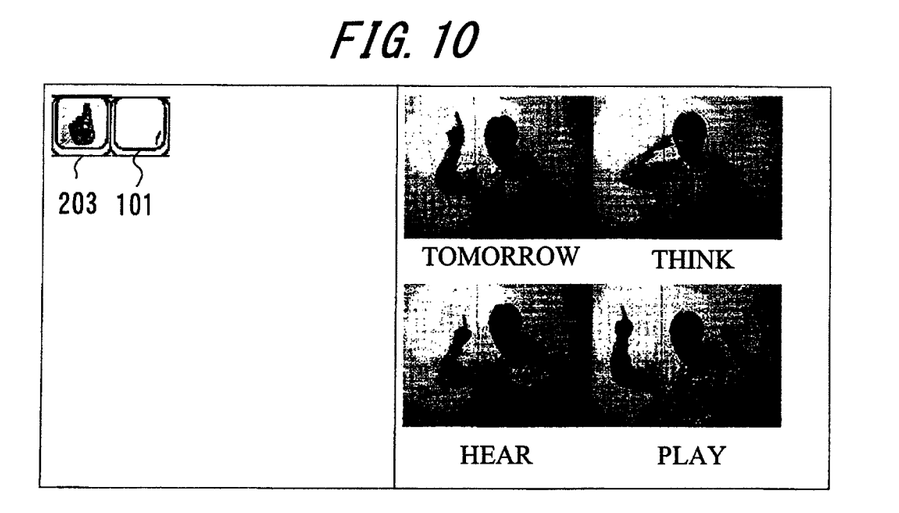
FIG. 10 illustrates a search procedure in the embodiment (2).
Figure 11:
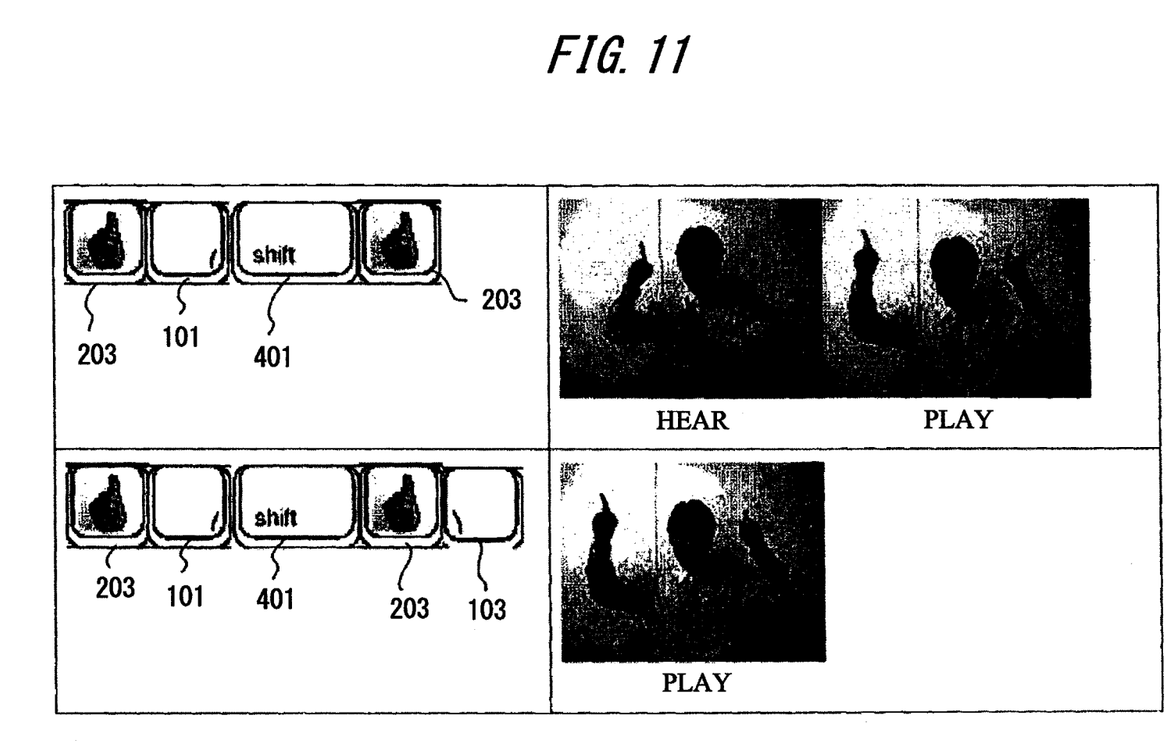
FIG. 11 illustrates a search procedure in the embodiment (3).

If the limitation is not completed yet by the limiting search shown in FIG. 10, the words can be limited or restricted by limiting the action of the sign language by further inputting the non-finger key. For example, as shown in FIG. 11, the forefinger of the left hand can be designated and inputted by depressing the finger key 203 while depressing the shift key 401 continuously to the finger key 203→the upper body input key 101 (see FIG. 11). At this stage, the limitation is made to the words corresponding to the sign language in which the forefinger of the left hand is used while arranging the forefinger of the right hand at the upper-right position with respect to the head. As a result, as shown in FIG. 11, the limitation is made to the words of "hear" and "play".

Finally, the upper body input key 103, which expresses the upper-left position with respect to the head, is depressed, and thus the action means the sign language action in which the forefinger of the left hand is arranged at the upper-left position with respect to the head. Accordingly, the limitation is finally made to the sign language action to mean the word of "play" in which the forefingers of the both hands are arranged at the upper positions with respect to the head respectively (see FIG. 11).

In this way, the sign language action is limited or restricted, and the words corresponding thereto are also progressively limited or restricted at every stage at which the keys are successively depressed in the order of finger key 203→upper body input key 101→shift key 401+finger key 203→upper body input key 103.

The embodiment described above has been explained for the case in which the independent keyboard is connected via the interface of the USB standard or the like to the personal computer installed with the sign language application program. However, there is no limitation thereto. The present invention may be realized by using, for example, an electronic dictionary, a smart phone or the like on condition that the keyboard having the key arrangement as shown in FIG. 1 is provided.

Further, the explanation has been made about the case in which the sign language application program is installed to the hard disk device of the personal computer. However, there is no limitation thereto. The program may be installed to a server, and the input result and the search result may be displayed on a terminal device via a communication network such as the interne or the like.

INDUSTRIAL APPLICABILITY

The sign language keyboard of the present invention can be utilized as the input system or the searching system for the meaning content expressed by the sign language and the electronic dictionary for the sign language.

DESCRIPTION OF THE REFERENCE SIGNS 101-106: upper body input area (upper body input key)
210-224: finger input area (finger input key)
301-305: wrist state input area (wrist state input key)
401: left shift key
402: finger bending key

What is claimed is:

1. An input apparatus for inputting sign language information to express a meaning content in cooperation of a finger action and a non-finger action, the input apparatus comprising:
  a plurality of upper body input keys in which divided upper body portions of a talker are assigned to the respective upper body input keys and each of the divided upper body portions is selected and inputted, the upper body input keys being arranged adjacent to each other according to a relative positional relation of the assigned upper body portion; and
  finger input keys in which shapes of fingers are allotted thereto one by one and each of the shapes of the fingers is selected and inputted,
  wherein:
  a sign language expression, which is dynamically changeable, can be inputted by discriminating, by an input discrimination unit, the shape of the finger inputted by the finger input key, and the portion of the upper body inputted by the upper body input key.

2. The input apparatus according to claim 1, wherein the input apparatus is a general-purpose keyboard in which the upper body input keys, and the finger input keys are allotted respectively on respective key tops.

3. The input apparatus according to claim 2, wherein the upper body input keys are arranged on a left side of the keyboard with respect to a sign language input operator, the finger input keys are arranged on a right side of the keyboard.

4. The input apparatus according to claim 1, wherein the upper body input keys and the finger input keys are displayed on a touch panel screen respectively as a keyboard image on a planar input screen.

5. A sign language searching apparatus for searching meaning information of sign language from a finger action and a non-finger action, the searching apparatus comprising an input unit comprising:
  a plurality of upper body input keys in which divided upper body portions of a talker are assigned to the respective upper body input keys and each of the divided upper body portions is selected and inputted, the upper body input keys being arranged adjacent to each other according to relative positional relation of the assigned upper body portion; and
  finger input keys in which shapes of fingers are allotted thereto one by one and each of the shapes of the fingers is selected and inputted;
  and
  a control unit which acquires finger action information from an input from the finger input key of the input unit and which thereafter predicts non-finger action information possibly combined with the finger action information from an input from the upper body input key to read a significant word composed of a combination of the finger action information and the non-finger action information stored in a storage unit so that the significant word is displayed on a display unit.

6. The sign language searching apparatus according to claim 5, wherein:
  the control unit acquires the finger action information to read the significant word comprising the combination of the finger action information and the non-finger action information stored in the storage unit so that the significant word is displayed on the display unit; and
  the control unit thereafter performs limiting search for the significant word by combining the finger action information and the non-finger action information from an input from the upper body input key if any information is further inputted from the upper body input key so that search result information is displayed on the display unit.

* * * * *